United States Patent [19]

Fuji

[11] 3,988,758

[45] Oct. 26, 1976

[54] SEMICONDUCTOR CAMERA-TUBE TARGET

[75] Inventor: Tatsuo Fuji, Tokyo, Japan

[73] Assignee: Nippon Electric Company, Ltd., Tokyo, Japan

[22] Filed: July 1, 1975

[21] Appl. No.: 592,322

[30] Foreign Application Priority Data

July 10, 1974 Japan .............................. 49-79437

[52] U.S. Cl. ...................................... 357/31; 357/54

[51] Int. Cl.[2] .................... H01L 27/14; H01L 31/00

[58] Field of Search .................... 357/31, 30, 52, 54

[56] References Cited

UNITED STATES PATENTS

| | | | |
|---|---|---|---|
| 3,670,213 | 6/1972 | Nakagawa | 317/234 R |
| 3,721,848 | 3/1973 | Knippenberg | 313/65 A |
| 3,748,549 | 7/1973 | Milch | 317/235 NA |
| 3,793,571 | 2/1974 | Janssen | 317/235 R |
| 3,909,308 | 9/1975 | Heagy | 148/1.5 |

*Primary Examiner*—Martin H. Edlow
*Attorney, Agent, or Firm*—Francis J. Murphy; John M. Calimafde

[57] ABSTRACT

A vidicon tube target includes a three-ply semi-insulating layer structure which comprises a bottom layer of $CeO_2$, an intermediate layer of $CePbO_{2+x}$ $(0<x<1)$, and a top layer of PbO. A camera tube incorporating this target operates with reduced initial dark current and with extreme stability.

1 Claim, 1 Drawing Figure

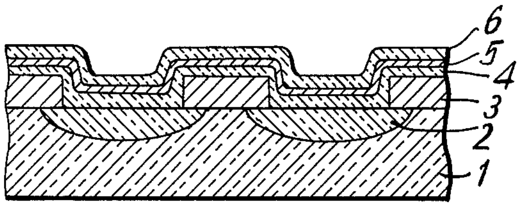
6
5
4
3
2
1

SEMICONDUCTOR CAMERA-TUBE TARGET

BACKGROUND OF THE INVENTION

This invention relates generally to vidicon-type camera tubes, and more particularly to an improved semiconductor target for use in such camera tubes.

Semiconductor targets used in vidicon type camera tubes typically comprise an n-type semiconductor crystal substrate having an array of light-sensitive elements arranged on one of its principal surfaces. The camera tube operates in a storage mode utilizing the depletion region formed by the reverse biasing of the individual light-sensitive elements. Accordingly, the dark current of vidicon tube targets is a recombination current that is thermally generated at recombination centers in the depletion region. Almost all of the recombination centers are in the interface-state (fast-state) at the interface between the n-type semiconductor crystal substrate and the insulating layer formed on the surface thereof for passivating the substrate surface regions lying between the light-sensitive elements. The magnitude of such target dark current is thus largely dependent on the fast-state density in the depletion region.

It is also known that the dynamic range of a vidicon tube depends largely upon the magnitude of the target dark current. For instance, in an ordinary mode of operation, a vidicon tube having a dynamic range of 32 dB with a dark current of 10 nA exhibits a dynamic range of 38 dB with a dark current of 5 nA and of 46 dB with a dark current of 2 nA. That is, the dynamic range of a vidicon tube increases as the dark current is reduced.

Moreover, when a vidicon tube is operated for an extended period of time, soft x-rays are generated therein and irradiation of the semiconductor target by such x-rays acts to increase the fast-state density of the target and hence its dark current. This increase in target dark current is proportional to the fourth to fifth power of the field mesh potential of the vidicon tube and to the length of time of tube operation. In other words, when a conventional vidicon tube is operated over an extended period of time there is a reduction in dynamic range, which is material, particularly in applications in which a high field mesh potential is employed to improve image resolution.

Under these circumstances, it is necessary to minimize the initial value of dark current while, on the other hand, preventing any substantial increase in dark current produced by irradiation of soft x-rays generated in the vidicon tube in order to obtain a dynamic range of a substantial width and to prevent reduction in the width of the dynamic range.

It has been suggested that an increase in dark current can be nearly completely prevented by forming a vapor-deposited film of PbO on the entire electron beam scanned surface of the semiconductor target as a semi-insulating layer thereon. This film is intended to reduce the negative charge buildup caused by scanning electrons on the surface of the insulating layer formed on the target. However, in the operation of semiconductor targets having a PbO film vapor deposited directly on their electron beam scanned surface, a partial extreme rise in dark current value must occur which is observed as a white blur on the dark current pattern of the vidicon tube, as such targets are heated unevenly during the vapor deposition of PbO and after their insertion into tube envelopes in different thermal stages of tube fabrication ending in the stage of vacuum sealing.

SUMMARY OF THE INVENTION

It is an object of the present invention to overcome the difficulties previously encountered as described above and to provide a semiconductor target for use in a camera tube of the vidicon type that has improved operating characteristics.

According to the present invention, there is provided a semiconductor camera-tube target of the type consisting of an n-type semiconductor single-crystal substrate on which a mosaic array of isolated light-sensitive elements is arranged on one of the principal surfaces. An insulating layer is formed on the substrate surface to passivate the substrate region between the isolated light-sensitive elements, and a semi-insulating layer is formed to cover the light-sensitive elements and the insulating layer. The target is characterized in that the semi-insulating layer is of a three-ply structure that includes a first layer of $CeO_2$ in direct contact with the light-sensitive elements and the insulating layer, a second layer of $CePbO_{2+x}$ ($0<x<1$) on the first layer, and a third layer of PbO on the second layer.

The above and other objects, features and advantages of the present invention will become apparent from the following description when read in conjunction with the accompanying drawing, in which the FIGURE represents a fragmentary diagrammatic cross section of a semiconductor camera-tube target according to a preferred embodiment of the invention.

DESCRIPTION OF THE PREFERRED EMBODIMENT

In the drawing, there is illustrated a semiconductor camera-tube target embodying the present invention which includes an n-type silicon single-crystal substrate 1 having on one of its principal surfaces an array of isolated light-sensitive elements of p-type silicon regions 2 formed in a mosaic pattern such as by diffusing a p-type impurity into the substrate surface. An insulating layer 3 of $SiO_2$ is formed on the substrate surface in lattice pattern around the p-type silicon regions 2 to electrically passivate the junctions thereof. Also formed on the substrate surface is a semi-insulating layer of a three-ply structure comprising a first layer 4 of $CeO_2$ covering the surfaces of the p-type silicon regions 2 and the $SiO_2$ layer 3 in direct contact therewith, a second, intermediate layer 5 of $CePbO_{2+x}$ ($0<x<1$) covering the surface of the $CeO_2$ layer, and a third, top layer 6 of PbO covering the $CePbO_{2+x}$ layer.

In this target structure, soft x-rays that may be generated in the vidicon tube are efficiently absorbed by the PbO layer 6 so that a rise in dark current of the target, as would occur in a conventional tube that is operated over an extended period of time, is effectively prevented. The first layer 4, of $CeO_2$, disperses heat to which the target is subjected during the vapor deposition of PbO and subsequently, after insertion of the finished target into a tube envelope, in a number of different thermal steps of tube fabrication ending in the step of vacuum sealing. This dispersion of heat by layer 4 prevents the target from being heated unevenly and, in this manner, prevents the occurrence of a white blue or partial extreme rise in dark current value. Further, a rise in dark current occurring uniformly over the entire target surface in various thermal steps of fabrication is also prevented as a result of the presence of the intermediate layer 5 of $CePbO_{2+x}$ although the reason for such rise in dark current is unknown.

An exemplary process for fabricating the target structure described above is now described.

First, an n-type silicon substrate is heated for high temperature thermal oxidation of its surface, thereby to form thereon a silicon dioxide layer of approximately 1 micron in thickness. Next, a mosaic pattern of apertures is formed in the silicon dioxide layer by conventional photoetching means. Subsequently, a p-type impurity element is diffused into the n-type silicon substrate through the apertures formed in the silicon dioxide layer, thereby to form on the substrate surface a mosaic pattern of p-type silicon regions which form junction diodes in the substrate. Then, $C_eO_2$ is vapor deposited in vacuum on the entire substrate surface on which the p-type silicon regions have been formed. The substrate thus formed thereon with a film layer of $C_eO_2$ is subjected to a low temperature heat treatment in a hydrogen atmosphere to reduce the initial dark current. Thereafter, a film of PbO is formed on the surface of the $C_eO_2$ film by vapor deposition in vacuum.

Immediately after the vapor deposition of PbO, the entire surface of the coated structure is again subjected to a low temperature heat treatment under a pressure of $10^{-5}$ torr or lower in order to form a layer of $C_ePbO_{2+x}(0<x<1)$ of extremely limited thickness at the interface between the PbO and $C_eO_2$ films by mutual diffusion of Pb and $C_e$ at the interface. A three-ply structure of semi-insulating layer is thus obtained on the substrate target surface to complete the desired semiconductor target.

It has been ascertained that camera tubes fabricated with semiconductor targets formed in this manner exhibit highly stable operating characteristics including an ample dynamic range. For example, with a semiconductor target of the present invention having a mosaic array of p-n junction diodes of 4 microns diameter and 8 microns center-to-center distance arranged on an n-type silicon crystal substrate of 10 ohm-cm specific resistivity and of (111) surface orientation, the initial dark current at 25° C of a vidicon tube fabricated with the target was 3.5 nA with a target voltage of 10 volts, the saturated value of dark current being 3.8 nA. In addition, no increase in dark current was observed even when the tube was operated for as long as 500 hours with a field mesh potential of 750 volts.

As will be appreciated from the foregoing description, vidicon tubes including a semiconductor target made according to the present invention exhibit excellent operating characteristics including very limited initial dark current value and the capability of operating for an extended period of time with no substantial rise in dark current and fully satisfy the previous requirements as regards the dynamic range of this type of camera tube.

Although one preferred embodiment of the present invention has been specifically shown and described herein, it will be apparent to those skilled in the art that various changes and modifications may be made with substantially the same successful results and without departing from the spirit and scope of the invention. For example, the semi-conductor substrate may be made of Ge, GaAs, InSb or similar semiconductor material other than silicon used in the embodiment illustrated. Also, the passivating insulator layer may be formed of $S_{i3}N_4$, $Al_2O_3$ or similar insulating material other than $SiO_2$. As regards the light-sensitive elements, n-p-n phototransistors, Schottky diodes or similar elements may be employed instead of the p-n junction diodes used in the illustrated embodiment.

What is claimed is:

1. In a semiconductor camera-tube target of the type consisting of an n-type semiconductor single-crystal substrate, a mosaic array of mutually isolated light-sensitive elements arranged on one of the principal surfaces of said single-crystal substrate, an insulating layer formed on the substrate surface to passivate the substrate region between said isolated light-sensitive elements, and a semi-insulating layer formed to cover the surfaces of said light-sensitive elements and said insulating layer, the improvement which comprises: said semi-insulating layer comprising a first layer of $C_eO_2$ in direct contact with said light-sensitive elements and said insulating layer, a second layer of $C_ePbO_{2+x}$ $(0<x<1)$ on said first layer, and a third layer of PbO on said second layer.

* * * * *